United States Patent
Koike (10) Patent No.: US 7,039,566 B2
(45) Date of Patent: *May 2, 2006

(54) METHOD OF ESTIMATING A LIFETIME OF HOT CARRIER OF MOS TRANSISTOR, AND SIMULATION OF HOT CARRIER DEGRADATION

(75) Inventor: Norio Koike, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 487 days.

This patent is subject to a terminal disclaimer.

(21) Appl. No.: 10/396,083

(22) Filed: Mar. 24, 2003

(65) Prior Publication Data

US 2003/0195728 A1 Oct. 16, 2003

(30) Foreign Application Priority Data

Mar. 26, 2002 (JP) ............................. 2002-086792

(51) Int. Cl.
*G06F 17/50* (2006.01)
*G01R 31/26* (2006.01)

(52) U.S. Cl. ............................. 703/2; 703/14; 324/769; 438/14

(58) Field of Classification Search .................... 703/2, 703/13, 14; 324/769, 765–768; 702/117; 438/14

See application file for complete search history.

(56) References Cited

U.S. PATENT DOCUMENTS

| 5,168,465 A | * | 12/1992 | Harari | 257/320 |
| 5,508,632 A | * | 4/1996 | Shimizu et al. | 324/769 |
| 5,999,011 A | * | 12/1999 | Chu et al. | 324/769 |
| 6,048,761 A | * | 4/2000 | En | 438/237 |
| 6,049,479 A | * | 4/2000 | Thurgate et al. | 365/185.18 |
| 6,173,235 B1 | * | 1/2001 | Maeda | 702/58 |
| 6,198,301 B1 | * | 3/2001 | Chetlur et al. | 324/769 |
| 6,342,816 B1 | * | 1/2002 | Gradzki | 330/311 |
| 6,524,872 B1 | * | 2/2003 | Cheung | 438/17 |
| 6,541,285 B1 | * | 4/2003 | Koike | 438/14 |
| 6,587,994 B1 | * | 7/2003 | Yamaji | 716/4 |

OTHER PUBLICATIONS

Sheu, et al., "BSIM: Berkely Short-Channel IGFET Model for MOS Transistors", IEEE Journal of Solid-State Circuits, vol. SC22, No. 4, pp. 558-566, Aug. 1987.

(Continued)

*Primary Examiner*—Thai Phan
(74) *Attorney, Agent, or Firm*—Hamre, Schumann, Mueller & Larson, P.C.

(57) ABSTRACT

A hot carrier lifetime of a MOS transistor is estimated, depending on model formulas: $1/\tau = 1/\tau_0 + 1/\tau_b$; $\tau_b \propto 1_{sub}^{-mb} \cdot I_d^{mb-2} \cdot \exp(a/|V_{bs}|)$, where $\tau$ denotes a lifetime, $I_{sub}$ denotes a substrate current, $I_d$ denotes a drain current, $V_{bs}$ denotes a substrate voltage, $\tau_0$ denotes a lifetime at the time the substrate voltage $V_{bs}=0$, $\tau_b$ denotes a quantity representing deterioration of a lifetime at the time the substrate voltage $|V_{bs}|>0$, and mb and 'a' are model parameters. Furthermore, a parameter Age representing a cumulative stress quantity is calculated depending on model formulas: $Age = Age_0 + Age_b$; $Age_b = \int 1/H_b [I_{sub}^{mb} \cdot I_d^{2-m}] \cdot \exp(-a/|V_{bs}|) dt$, where t denotes time, $H_b$ is a model parameter, $Age_0$ denotes a parameter representing a cumulative stress quantity at the time the substrate voltage $V_{bs}=0$, and $Age_{bs}$ denotes a quantity representing an increase of the cumulative stress quantity at the time the substrate voltage at $|V_{bs}|>0$. Thereby, a lifetime in actual use is determined with accuracy even when a substrate voltage is applied, and circuit characteristic degradation is simulated with high accuracy.

4 Claims, 7 Drawing Sheets

OTHER PUBLICATIONS

Chan et al., "A Simple Method to Characterize Substrate Current in MOSFET's", IEEE Electron Device Letters, vol. EDL-5, No. 12, pp. 505-507, Dec. 1984.

Quader, et al., "A Bidirectional NMOSFET Current Reduction Model for Simulation of Hot-Carrier-Induced Circuit Degradation", IEEE Transactions on Electron Devices, vol. 40, No. 12, pp. 2245-2254, Dec. 1993.

Kuo, et al., "Simulation of MOSFET Lifetime Under AC Hot-Electron Stress", IEEE Transactions on Electron Devices, vol. 35, No. 7, pp. 1004-1011, Jul. 1988.

Tu, et al., "Berkeley Reliability Tools—BERT", IEEE Transactions on Computer-Aided Design of Integrated Circuits and Systems, vol. 12, No. 10, pp. 1525-1534, Oct. 1993.

Takeda, et al., "An Empirical Model for Device Degradation Due to Hot-Carrier Injection", IEEE Electron Device Letters, vol. EDL-4, No. 4, pp. 111-113, Apr. 1983.

Murakami, et al., "Impact of Low-Standby-Power Device Design on Hot Carrier Reliability", Symposium on VLSI Technology Digest of Technical Papers, pp. 119-120, 2001.

* cited by examiner

METHOD OF ESTIMATING A LIFETIME OF HOT CARRIER OF MOS TRANSISTOR, AND SIMULATION OF HOT CARRIER DEGRADATION

FIELD OF THE INVENTION

The present invention relates to a method of estimating a lifetime concerning hot carrier degradation of a MOS transistor. More specifically, it relates to improvement of accuracy in lifetime estimation in a case of applying a substrate voltage. The present invention also relates to a method of simulating circuit characteristic degradation caused by hot carrier degradation of a MOS transistor. More specifically, it relates to improvement of simulation in a case of applying a substrate voltage.

BACKGROUND OF THE INVENTION

The size of MOS transistors has been reduced considerably with a trend toward high density, high integration and miniaturization of semiconductor integrated circuit devices. With the miniaturization trend, especially due to the decreasing channel length, hot carrier degradation has been a critical problem, since the degradation will affect the reliability of a MOS transistor. Hot carrier degradation refers to a phenomenon in which highly energized electrons and positive holes (hereinafter 'hot carrier') are generated by a high electric field at a drain end of a MOS transistor, which will degrade the characteristics of a gate oxide film. This hot carrier degradation includes plural degradation modes. In degradation under a condition to cause a maximum substrate current or degradation under a condition that the gate voltage $V_{gs}$ is a half the drain voltage $V_{ds}$, a drain current is decreased over time for both N-type and P-type MOS transistors. As a result, the delay time of the circuit is increased over time. When the delay reaches a certain degree, a timing error occurs at a time of input/output of signals within the semiconductor integral circuit or between the circuit and outside, and this causes a malfunction of an entire system in which the semiconductor integrated circuit is assembled.

Regarding the hot carrier degradation, hot carrier reliability has been evaluated by a stress acceleration experiment under a DC (direct current) condition with respect to the MOS transistor. Product reliability has been provided by optimizing a production process to satisfy the hot carrier evaluation standard.

A hot carrier lifetime model used in such a hot carrier reliability evaluation is as follows. Hot carrier degradation of a MOS transistor is evaluated by, for example, $\Delta I_d/I_d$, and this is a ratio of a drain current variation $\Delta I_d$ to an initial drain current $I_d$. Under a static hot carrier stress condition by a DC, the hot carrier degradation rate $\Delta I_d/I_d$ is represented by the following formula (1).

$$\Delta I_d/I_d = A \cdot t^n \tag{1}$$

Here, 't' denotes a hot carrier stress time, while characters 'A' and 'n' are regarded as coefficients depending on a transistor manufacturing process and a stress condition.

If a transistor lifetime $\tau$ is defined as a stress time required for a variation rate of drain current to reach $(\Delta I_d/I_d)_f$, a formula (2) is obtained from the formula (1). For example, time t when $(\Delta I_d/I_d)_f = 10\%$ is defined as a lifetime $\tau$.

$$(\Delta I_d/I_d)_f = A \tau^n \tag{2}$$

In a typical stress acceleration experiment for a MOS transistor, DC stress is applied to a transistor so that the transistor lifetime reaches a variation rate $(\Delta I_d/I_d)_f$ defined by the formula (2) within a measureable time period, that is, from 1 second to about 100,000 seconds. Then, a drain current of the transistor is measured to calculate a transistor lifetime from $\Delta I_d/I_d$ in a linear region or a saturation region.

The following stress voltage application method is used in a stress acceleration experiment during a hot carrier reliability evaluation. Every gate voltage $V_g$ is determined under a condition where the hot carrier degradation rate is maximized with respect to each of plural drain voltages $V_d$ used for the acceleration experiment. In other words, each of the gate voltages $V_g$ causes a maximum substrate current $I_{sub}$ under a respective drain current. At this time, one gate voltage is set for each drain voltage. In this way, a transistor lifetime is calculated under a condition in which the degradation rate is maximized with respect to an arbitrary drain voltage.

A method of evaluating hot carrier reliability of a MOS transistor is described in IEEE Electron Device Lett., vol. 4, pp. 111–113, April 1983 by E. Tanaka et al. According to the description, the lifetime $\tau$ of a MOS transistor is calculated by using an empirical model represented by the following formula (3).

$$\tau \propto \exp(-C/V_{ds}) \tag{3}$$

In this formula, $V_{ds}$ denotes a voltage between a drain and a source, and C denotes a fitting parameter.

Furthermore, a method of evaluating hot carrier reliability of a MOS transistor for a case in which a substrate voltage $V_{bs}$ is applied is described, for example, in Proc. IEEE VLSI Tchnol. Symp., pp. 119–120, 2001 by E. Murakami et al. According to the description, the lifetime $\tau$ of a MOS transistor is determined by using an empirical model represented by the following formula (4).

$$\tau \propto \exp(-C(1/V_{ds}+1/V_{db})) \tag{4}$$

Figure 5:
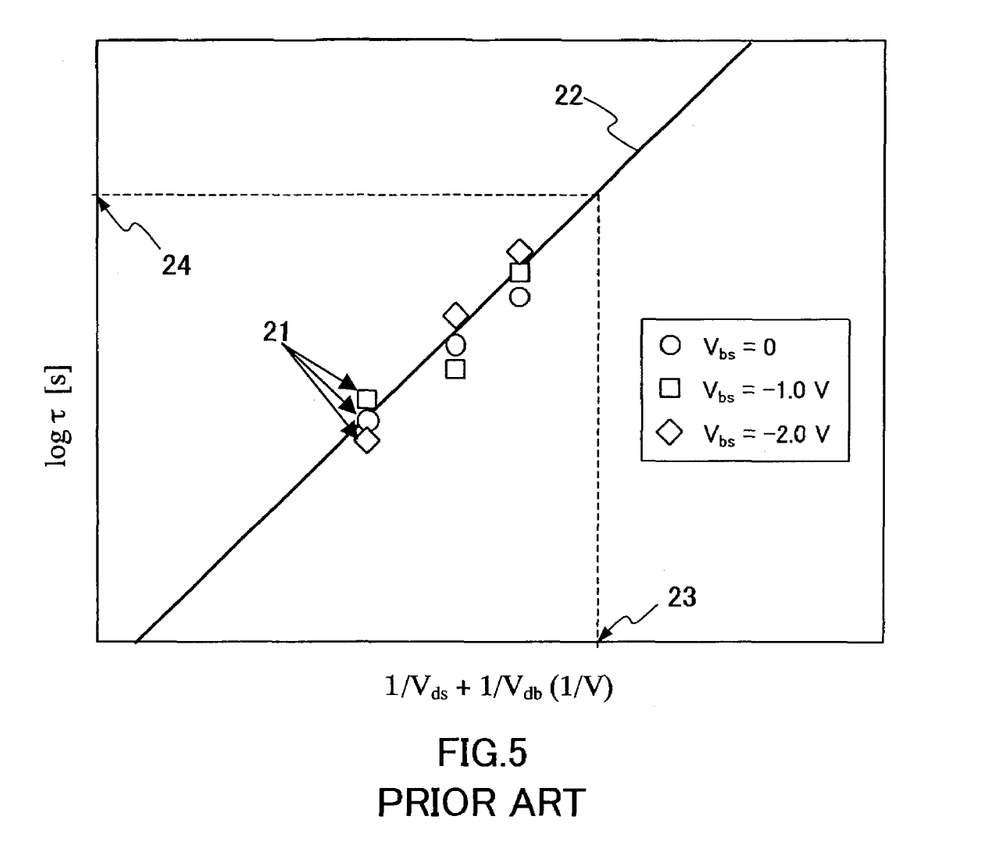
FIG. 5 is an explanatory view to show a conventional method of estimating a lifetime.

FIG. 5 shows a method of estimating a lifetime based on this empirical model. In FIG. 5, each of the elements 21 denotes a measured value of the lifetime under a condition to cause a maximum substrate current or under a condition that a gate voltage $V_{gs}=V_{ds}/2$, and a line 22 denotes a regression line of lifetime estimation. Numeral 23 denotes a value of $1/V_{ds}+1/V_{db}$ in actual use, and 24 denotes an estimated lifetime in actual use. For a lifetime estimation, $1/V_{ds}+1/V_{db}$ is used to enter a horizontal axis of a graph, and a logarithm of $\tau$ is used to enter the vertical axis so that the measured values 21 for a lifetime are plotted. Next, the regression line 22 is fitted to the measured values 21 by using a least squares method. The regression line 22 is used to obtain a lifetime corresponding to the $1/V_{ds}+V_{db}$ in actual use, and this is determined as an estimated lifetime 24 in actual use. Hot carrier reliability evaluation is executed by observing whether the lifetime 24 satisfies a hot carrier evaluation standard, e.g., whether the lifetime 24 satisfies a standard of at least 10 years.

Recently however, such a conventional hot carrier evaluation standard has been difficult to satisfy in the hot carrier reliability evaluation under the DC condition. For solving this problem, a recently developed technique provides product reliability by a simulation of hot carrier degradation for a semiconductor integrated circuit (hereinafter "circuit reliability simulation"). A circuit reliability simulator simulates a circuit operation subsequent to hot carrier degradation by using a hot carrier lifetime model and a SPICE parameter after degradation, and the simulation is based on calculated values of voltage and current at every terminal of every transistor, which are calculated by a circuit simulator SPICE. Typical simulators are BERT developed at the University of California, Berkeley (R. H. Tu et al., "Berkeley reliability tools-BERT," IEEE Trans. Compt.-Aided Des. Integrated Circuits & Syst., vol. 12, no. 10, pp. 1524–1534, October 1993), and BTABERT (a commercial version of BERT). This circuit reliability simulation technique is used for estimating degraded or malfunctioning parts in a semiconductor integrated circuit and measures against the degradation or malfunction are taken during designing, so that reliability assurance or reliability design is possible.

An example of simulation methods concerning hot carrier degradation of a MOS transistor is described in IEEE Trans. Electron Devices, vol. 35, pp. 1004–1011, July 1988 by Kuo et al. A hot carrier lifetime model applied to this circuit reliability simulator is as follows. According to Kuo et al., a lifetime τ of a MOS transistor is represented by an empirical formula (5) using a hot carrier lifetime model.

$$\tau = ((\Delta I_d/I_d)_f)^{1/n} \cdot H \cdot W \cdot I_{sub}^{-m} \cdot I_d^{m-1} \quad (5)$$

In the formula, W denotes a gate width, H denotes a coefficient depending on a condition for manufacturing a transistor, $I_{sub}$ denotes a substrate current, and m denotes an index relating to an impact ionization and interface level formation.

A coefficient A in a hot carrier lifetime model is represented by a formula (6) that is derived from the formulas (2) and (5).

$$A = ((W \cdot H)^{31\,1} \cdot I_{sub}^{m} \cdot I_d^{1-m})^n \quad (6)$$

Therefore, a formula (7) is derived from the formulas (1) and (6).

$$\Delta I_d/I_d = ((W \cdot H)^{-1} \cdot I_{sub}^{m} \cdot I_d^{1-m} \cdot t)^n \quad (7)$$

When Age is defined for convenience as in the following formula (8), the formula (7) can be rewritten into a formula (9).

$$\text{Age} = (W \cdot H)^{-1} I_{sub}^{m} \cdot I_d^{1-m} \cdot t \quad (8)$$

$$\Delta I_d/I_d = (\text{Age})^n \quad (9)$$

In the formula (8), 'Age' represents a stress quantity from a start of hot carrier stress to a time t in a hot carrier lifetime model. From a physical point of view, it represents a total quantity of hot carrier having an energy of at least a critical energy to generate damage in a MOS transistor.

The parameters n, H and m used in the formulas (4)–(9) are regarded as hot carrier lifetime parameters. These hot carrier lifetime parameters are functions of vertical electric field strength at a drain end where the hot carrier is generated. Therefore, these parameters are represented as functions of a gate-drain voltage $V_{gd}$.

Figure 7:
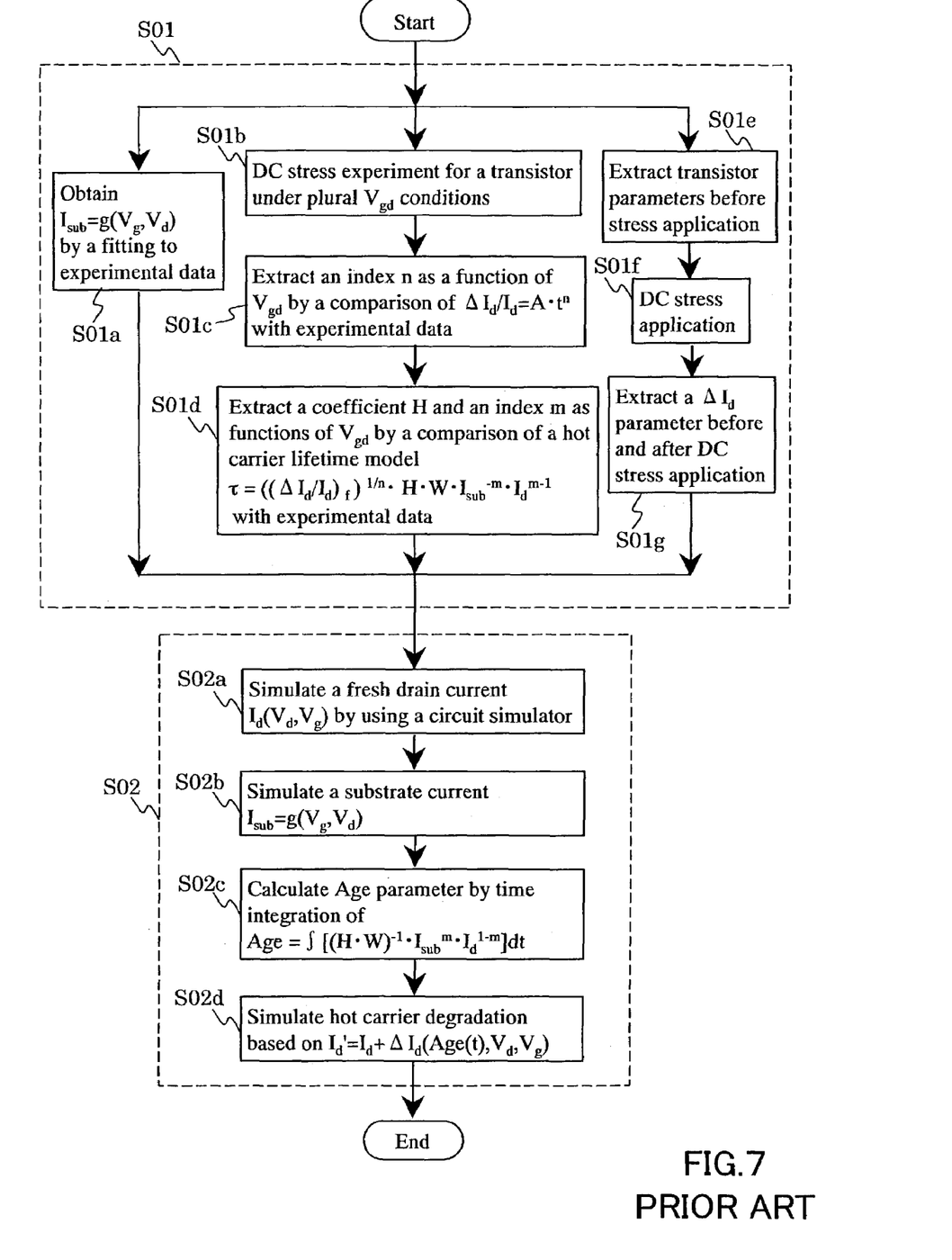
FIG. 7 is a flow chart to show a conventional method of simulating hot carrier degradation of a MOS transistor.

FIG. 7 shows a method of simulating characteristics after degradation by using a $\Delta I_d$ model. A simulation method using a $\Delta I_d$ model is described in IEEE Trans. Electron Devices, vol. 40, pp. 2245–2254, December 1993 by Quader et al.

Figure 6A:
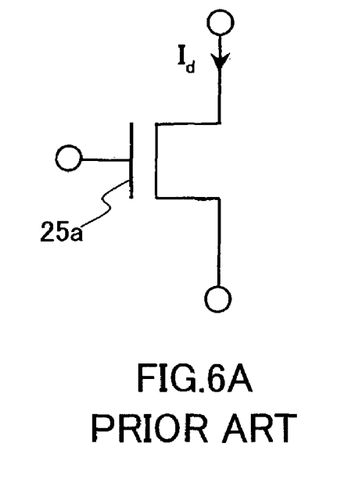
FIGS. 6A and 6B are equivalent circuit diagrams to show a conventional method of simulating hot carrier degradation of a MOS transistor.
Figure 6B:
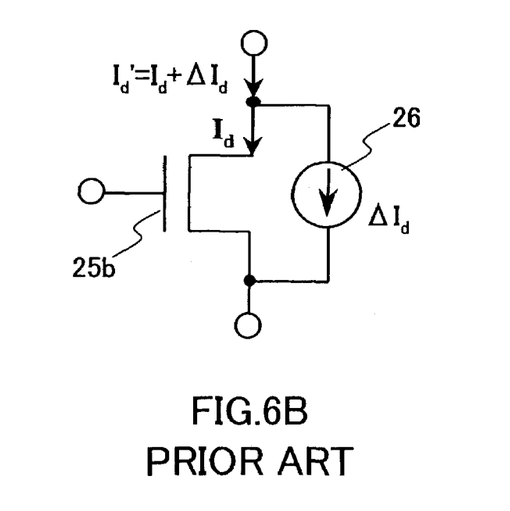

FIGS. 6(A) and 6(B) are equivalent circuit diagrams showing a method of simulating hot carrier degradation of a MOS transistor. In FIGS. 6(A) and 6(B), 25a denotes a fresh MOS transistor before stress application, 25b denotes a MOS transistor after stress application, and 26 denotes a variable current source. FIG. 6(A) shows a drain current $I_d$ flowing in a fresh MOS transistor 25a before stress application. FIG. 6(B) shows a drain current $I_d'$ flowing in a MOS transistor 25b after hot carrier degradation. It is shown that the drain current flowing in the transistor changes from the initial drain current $I_d$ by $\Delta I_d$ due to the hot carrier degradation.

As shown in the following formula (10), a drain current $I_d'$ after degradation is simulated by adding degradation $\Delta I_d$ of a drain current to a fresh drain current $I_d$ before stress application.

$$I_d' = I_d(V_d, V_g) + \Delta I_d(\text{Age}, V_d, V_g) \quad (10)$$

$\Delta I_d$ is a function of Age as stress quantity from the start of hot carrier stress to a time t, as well as a function of a drain voltage $V_d$ and a gate voltage $V_g$. For calculating Age under a dynamic stress condition by AC (alternating current) in a circuit, the formula (8) is rewritten into the following formula (11) as an integral form over time for calculation.

$$\text{Age} = \int [(W \cdot H)^{-1} I_{sub}^{m} \cdot I_d^{1-m}] dt \quad (11)$$

In this simulation, $\Delta I_d$ is represented by an equivalent circuit prepared by adding a variable current source 26 shown in FIG. 6(B) to a source-drain of an initial MOS transistor. At this time, a transistor parameter to calculate the initial drain current is not changed.

FIG. 7 is a flow chart to show a process to simulate hot carrier degradation of a MOS transistor according to a conventional technique. In this flow chart, a step S01 includes sub-steps S01a–S01g to extract an unknown parameter in the formulas (10) and (11) with respect to a hot carrier lifetime model by a preliminary measuring experiment.

In the sub-step S01a, a model formula $I_{sub} = g(V_g, V_d)$ is determined to fit to measurement data of plural substrate currents $I_{sub}$ in a preliminary measuring experiment, so that the substrate current $I_{sub}$ in the formula (11) is determined. Here, $V_g$ denotes a gate voltage, and $V_d$ denotes a drain voltage. An example of a method for determining a substrate current $I_{sub}$ is described in IEEE Electron Device Lett., vol. EDL-5, pp. 505–507, December 1984 by Chan et al.

The sub-steps S01b–S01d are for extracting hot carrier lifetime parameters in a preliminary measuring experiment. In the sub-step S01b, a stress voltage is applied to a MOS transistor, and a hot carrier lifetime defined by the formula (2) is measured. For applying the stress voltage, a gate voltage $V_g$ is set so that a gate-drain voltage $V_{gd}=V_g-V_d$ is constant with respect to plural drain voltages $V_d$. In this method, typically plural numbers of $V_{gd}$ are set, and also gate voltages $V_g=V_d+V_{gd}$ corresponding to the plural $V_{gd}$ are set with respect to every drain voltage $V_d$. In the following sub-step S01c, coefficient n is extracted as a function of $V_{gd}$ by a comparison between the empirical formula (1) and data concerning measurement points in a DC stress experiment for the sub-step S01b. Similarly in the sub-step S01d, an index m and a coefficient H are extracted as functions of $V_{gd}$ by a comparison between the empirical formula (5) and data concerning measurement points in a DC stress experiment for the sub-step S01b.

Sub-steps S01e–S01g are for determining a fresh drain current $I_d$ before stress application and degradation $\Delta I_d$ of the drain current in the formula (10) for a $\Delta I_d$ model. In the sub-step S01e, transistor parameters such as carrier mobility and a flat-band voltage are extracted. Such parameters are used for determining fresh drain current $I_d(V_d, V_g)$ before stress application. BSIM (Berkeley Short-Channel IGFET Model) is used for a model to determine such a fresh drain current $I_d(V_d, V_g)$. The BSIM is described in detail in IEEE J. Solid-State Circuits, vol. SC-22, pp. 558–566, August 1987 by Sheu et al. Subsequently in the sub-step S01f, DC stress is applied to the transistor. In the sub-step S01g, $\Delta I_d$ model parameters are extracted before and after the DC stress application. The drain current degradation $\Delta I_d$(Age, $V_d$, $V_g$) is determined by the $\Delta I_d$ model parameters. The $\Delta I_d$ model is described by Quader et al. in relation to NMOS. PMOS is described in JP-A-08–64814 by Shimizu et al.

The transistor parameters should be extracted before DC stress application so that actual transistor characteristics before the stress application coincide with simulated transistor characteristics. The $\Delta I_d$ model parameters should be extracted before and after the DC stress application so that the actual drain current degradation $\Delta I_d$ before and after the stress application coincides with the simulated drain current degradation $\Delta I_d$.

The step S02 includes sub-steps S02a–S02d so that a reliability simulator simulates hot carrier degradation of a transistor in accordance with parameters extracted in the step S01 and also with the formulas (10) and (11).

In the sub-step S02a, a drain current is simulated by transistor parameters before stress application, where the parameters have been extracted in the prior sub-step S01e. In the sub-step S02b, a substrate current is simulated on the basis of a substrate current model formula $I_{sub}=g(V_g, V_d)$ determined by the S01a. In the sub-step S02c, Age, which represents degradation of each transistor based on the formula (11), is calculated by time-integrating functions of a drain current $I_d$ and a substrate current $I_{sub}$ in a circuit. At this time, the drain current $I_d$ simulated in the sub-step S02a, the substrate current $I_{sub}$ simulated in the sub-step S02b, and hot carrier lifetime parameters H and m calculated in the sub-step S01d, are used. In the sub-step S02d, hot carrier degradation of the transistor is simulated by using the formula (10) on the basis of the Age.

Figure 8:
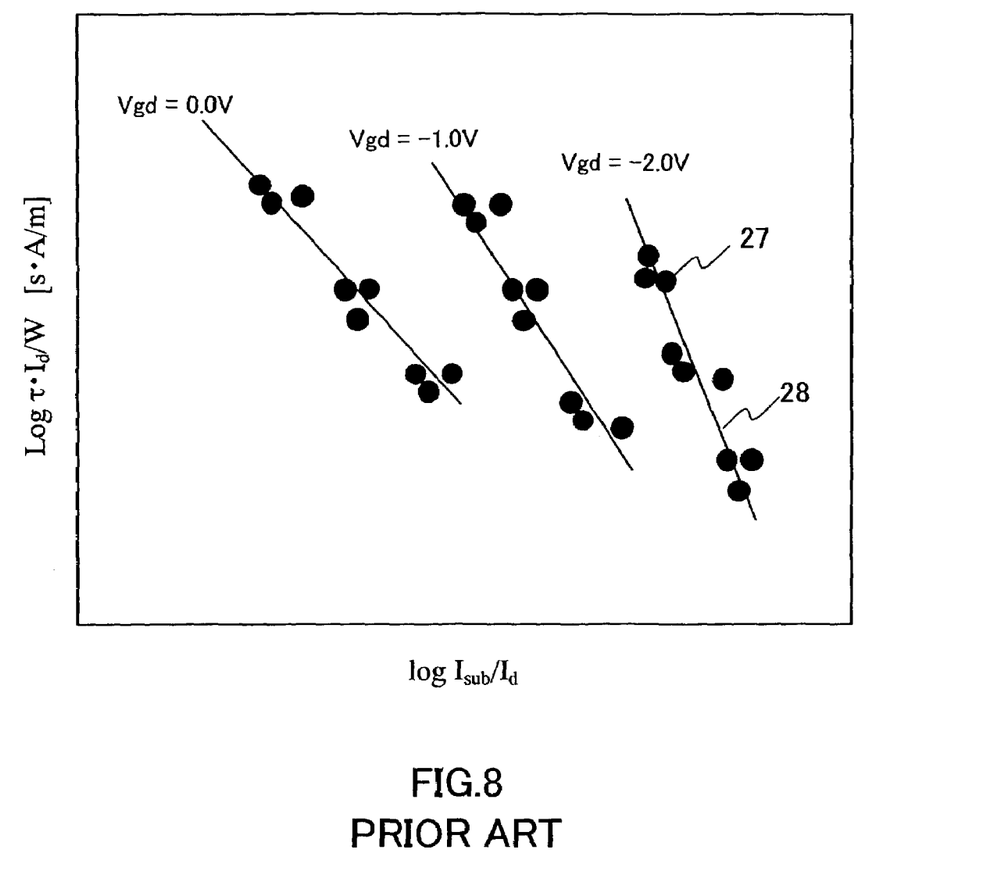
FIG. 8 is an explanatory view to show a conventional method of extracting a hot carrier lifetime parameter.

The following is a detailed explanation of a method of extracting hot carrier lifetime parameters H and m for a hot carrier lifetime model. FIG. 8 is an explanatory view of a method of extracting hot carrier lifetime parameters H and m. FIG. 8 relates to a plot for calculating hot carrier lifetime parameters H and m included in the empirical formula (5) using a hot carrier lifetime model. In FIG. 8, the vertical axis is a logarithmic scale of a value $\tau \cdot I_d/W$ calculated from a lifetime $\tau$ in a DC stress experiment, a drain current $I_d$ during a stress and a gate width W of a MOS transistor. The horizontal axis is a logarithmic scale of a ratio $I_{sub}/I_d$ when $I_{sub}$ is a substrate current during a stress and $I_d$ is a drain current. Numeral 27 denotes data concerning a plurality of measurement points in a DC stress experiment, and 28 denotes a line fitted with respect to data concerning the measurement points. The MOS transistor lifetime $\tau$ is measured under plural gate-drain voltage $V_{gd}$ conditions, e.g., under three conditions of $V_{gd}$=0.0, –1.0, and –2.0 V, so that data 27 for plural measurement points are obtained. A line 28, fitted by a least squares method with respect to data 27 concerning the measurement points, is obtained. Hot carrier parameters H and m are obtained respectively from an intercept and a gradient of the line 28. By executing this method for plural $V_{gd}$, the hot carrier lifetime parameters H and m in a hot carrier lifetime model can be calculated as functions of $V_{gd}$.

The above description is about a conventional method of estimating a lifetime of hot carrier degradation of a MOS transistor, and a conventional method of simulating degradation in circuit characteristics caused by the hot carrier degradation. However, these methods can cause the following problems.

First, in the method of estimating a lifetime of hot carrier degradation of a MOS transistor, the model formula (4) adopting an effect of a substrate voltage lacks explicit physical grounds, and the repeatability will not be assured. Secondly, since a lifetime is represented as a function of a drain voltage and a substrate voltage, the lifetime cannot be predicted accurately with respect to an arbitrary gate voltage.

A third problem is that a lifetime under a condition in which a hot carrier degradation rate is maximized will be estimated as longer than its actual lifetime. Therefore, depending on use conditions, the lifetime in actual use of the MOS transistor may be shorter than the lifetime estimated corresponding to this model. That is, the quality of the product cannot be assured appropriately.

Regarding the method of simulating circuit characteristic degradation caused by the hot carrier degradation, the effect of the substrate voltage with respect to the hot carrier degradation is not included in the conventional hot carrier lifetime model represented by the formula (5). According to the formula (4), the lifetime will be shortened in comparison with the conventional hot carrier lifetime model formula (5) when a substrate voltage is applied. Therefore, in a case of applying a substrate voltage, the lifetime in actual use will be shorter than the simulation result obtained by using the conventional model formula (5). However, as described above, the model formula (4) cannot be used for the simulation of the circuit characteristic degradation, due to a lack of repeatability based on physical grounds and gate voltage dependency.

The conventional model formula (5) is based on a hypothesis that hot carrier degradation occurs due to one kind of hot carrier, that is electrons or holes, having an energy of not lower than the critical energy required for causing damage on the MOS transistor, and that the hot carrier lifetime is inversely proportional to the yield of this one kind of hot carrier. According to this model, it is difficult to provide a hot carrier lifetime model adopting a physical effect with respect to the hot carrier degradation in the substrate voltage.

SUMMARY OF THE INVENTION

In order to solve the above-identified problems, the present invention provides a method of estimating a lifetime of hot carrier degradation of a MOS transistor, so that the lifetime is determined with accuracy by adopting an effect of a substrate voltage based on physical grounds with respect to a hot carrier lifetime and also by providing a hot carrier lifetime model for representing a gate voltage dependency with accuracy, and thus providing assurance for a product.

In the method of simulating circuit characteristic degradation caused by the hot carrier degradation, the present invention provides a model formula, based on physical grounds, including an effect of a substrate voltage with respect to hot carrier degradation, realizing a highly accurate simulation even for a case of applying a substrate voltage in order to provide product reliability at a time of designing and to provide high transistor performance.

For achieving the above-described objects, in a method of estimating a hot carrier lifetime of a MOS transistor according to the present invention, estimation is conducted, based on a hot carrier lifetime model expressed by the following formulas.

$$1/\tau=1/\tau_0+1/\tau_b$$

$$\tau_b \propto 1_{sub}^{-mb} \cdot I_d^{mb-2} \cdot \exp(a/|V_{bs}|)$$

In the formulas, $\tau$ denotes a lifetime, $I_{sub}$ denotes a substrate current, $I_d$ denotes a drain current, $V_{bs}$ denotes a substrate voltage, $\tau_0$ denotes a lifetime at the time $V_{bs}=0$, $\tau_b$ denotes a deterioration of lifetime at the time the substrate voltage $|V_{bs}|>0$, and both mb and 'a' are model parameters.

This hot carrier lifetime model is based on a theory that hot carrier degradation occurs due to re-bonding of two kinds of hot carriers, i.e., electrons and holes having an energy not lower than the critical energy required for causing damage on the MOS transistor, and that the hot carrier lifetime is inversely proportional to a yield of the two kinds of hot carriers. For this model, model formulas representing the hot carrier lifetime $\tau$ can be shown as the following formulas (12), (13), and (14) replacing the conventional formula (4) or (5), where the model parameters are m0, $H_0$, mb and $H_b$.

$$1/\tau = 1/\tau_0 + 1/\tau_b \quad (12)$$

$$\tau_0 = ((\Delta I_d/I_d)_f)^{1/n} \cdot H_0 W \cdot I_{sub}^{-m0} \mathbf{19} \, I_d^{m0-2} \quad (13)$$

$$\tau_b = ((\Delta I_d/I_d)_f)^{1/n} \cdot H_d \cdot W^2 \cdot I_{sub}^{-mb} \cdot I_d^{mb-2} \cdot exp(a/|V_{bs}|) \quad (14)$$

$$mb = ((\Phi_h/\lambda_h)/(\Phi_{ei}/\lambda_e)) + 2$$

Here, $\tau_0$ denotes a lifetime at the time the substrate voltage $V_{bs}=0$, and $\tau_b$ denotes a quantity representing deterioration of the lifetime at the time the substrate voltage $|V_{bs}|>0$, which represents degradation caused by re-bonding among the primary hot carriers. $\Phi_h$ denotes a critical energy of holes to generate damage, $\Phi_{ei}$ denotes an impact ionization energy of electrons, and $\lambda_h$ and $\lambda_e$ denote respectively mean free paths of holes and electrons.

The model formula (13) is distinguished from the conventional model formula (5) in that the formula (13) adopts a functional form of (exponent of $I_d$)=−(exponent of $I_{sub}$)−2, while the conventional formula adopts (exponent of $I_d$)=−(exponent of $I_{sub}$)−1. The difference is caused by the fact that a hot carrier lifetime is inversely proportional to a yield of one kind of hot carrier in a conventional technique, while the same lifetime is inversely proportional to a yield of two kinds of hot carriers in the present invention.

It was confirmed by a comparison with measured values of N-type and P-type MOS transistors that a model of the present invention corresponds well to a measured value, and $V_{gd}$ dependence of the hot carrier lifetime parameters $H_0$ and m0 is decreased considerably.

The model formula (14) represents the deterioration of the lifetime at the time the substrate voltage $|V_{bs}|>0$. This formula represents hot carrier degradation caused by re-bonding between a secondary hot carrier occurring due to application of the substrate voltage and the primary hot carrier.

Though the model parameters $H_0$ and $H_b$ correspond to measured values well even if they are regarded as constants, the parameters actually have a weak dependency on $V_{gd}$, since the depth of a current path at the edges in a MOS transistor varies depending on $V_{gd}$. The depth of the current path has a weak dependency on $V_{gd}$.

According to a lucky electron model (C. Hu et al., IEEE Trans. Electron Devices, vol. 23, pp. 375–385, February 1985), the quantity of the hot carrier is decreased exponentially with respect to the distance. Therefore, the effects have an exponential dependency on the $V_{gd}$. As a result, $H_0$ and $H_b$ are represented by the following formulas (15) and (16).

$$H_0 \propto exp(H_0 \cdot |V_{gd}|) \quad (15)$$

$$H_b \propto exp(H_b \cdot |V_{gd}|) \quad (16)$$

In general, sufficient accuracy can be realized for $H_0$ and $H_b$ even when they are regarded as constants.

For estimating a lifetime of hot carrier degradation according to the present invention, hot carrier lifetime parameters n, $H_0$, m0, Hb, mb and 'a' in the formulas (12), (13) and (14) are determined as constants on the basis of values measured in a stress acceleration experiment. From these parameters and the formulas (12) and (13), a hot carrier lifetime in actual use is determined on the basis of measured values of the substrate current $I_{sub}$ and the drain current $I_s$ in actual use, which is determined as an estimated lifetime in actual use.

In the simulation of hot carrier degradation of the MOS transistor according to the present invention, a parameter Age representing cumulative stress quantity with respect to the MOS transistor is calculated by a model formula expressed below.

$$Age = Age_0 Age + Age_b$$

$$Age_b = \int 1/H_b [I_{sub}^{mb} \cdot I_d^{2-m}] \cdot exp(-a/|V_{bs}|) dt$$

Here, t denotes time, $I_{sub}$ denotes a substrate current, $I_d$ denotes a drain current, $V_{bs}$ denotes a substrate voltage, $H_b$, mb and a are model parameters, $Age_0$ denotes a parameter representing a cumulative stress quantity with respect to a MOS transistor at the time the substrate voltage $V_{bs}=0$, $Age_{bs}$ denotes a quantity representing an increase in a cumulative stress quantity with respect to the MOS transistor at the time the substrate voltage $|V_{bs}|>0$.

For example, in a method of simulating circuit characteristic degradation caused by hot carrier degradation of a MOS transistor, the formula (11) is replaced by the following formula (17) as an integral over time.

$$Age = Age_0 + Age_b \quad (17)$$

$$Age_0 = \int 1/H_0 \cdot (I_d/W)^2 (I_{sub}/I_d)^{m0} \cdot dt \quad (18)$$

$$Age_b = \int \mathbf{1}/H_b \cdot (I_d/W)^2 (I_{sub}/I_d)^{mb} \cdot exp(-a/|V_{bs}|) dt \quad (19)$$

Furthermore, in extraction of hot carrier lifetime parameters, the hot carrier lifetime parameters $H_0$, m0, $H_b$, and mb are determined as constants on the basis of values measured in a stress acceleration experiment. The model formula (18) is distinguished from the conventional model formula (11) in that the formula (18) adopts a functional form of (exponent of $I_d$)=2−(exponent of $I_{sub}$), while the conventional formula adopts (exponent of $I_d$)=1−(exponent of $I_{sub}$). The difference is caused by the fact that a hot carrier lifetime is inversely proportional to a yield of one kind of hot carrier in a conventional technique, while the same lifetime is inversely proportional to a yield of two kinds of hot carriers in the present invention. The hot carrier lifetime parameters $H_0$, m0, H, mb included in the model formulas (17), (18), and (19) are identical to those in the model formulas (12), (13) and (14) according to the present invention. The $V_{gd}$ dependency is small remarkably, and sufficient simulation accuracy can be obtained even when the parameters are regarded as constants.

In the model formulas (12), (13) and (14), the dependency of the hot carrier lifetime on the substrate voltage and the gate voltage can be estimated accurately with respect to a wide range of voltage. Therefore, in the method of estimating a lifetime of hot carrier degradation of a MOS transistor of the present invention, a lifetime in actual use can be estimated with accuracy on the basis of a small number of measured values under a stress voltage condition and both the drain current $I_d$ and substrate current $I_{sub}$ in actual use. Thus, the present invention can provide assurance for the product properly.

In a method of simulating a circuit characteristic degradation due to hot carrier degradation of a MOS transistor according to the present invention, a highly accurate simulation corresponding well to measured values in product degradation can be realized with repeatability even under a condition that a substrate voltage is applied. Therefore, there is no need for applying a process reliability evaluation standard having an excessive reliability margin for quality assurance. As a result, the reliability evaluation standard is satisfied and the transistor performance can be improved further.

DETAILED DESCRIPTION OF THE INVENTION

Embodiments according to the present invention are further explained below by referring to the drawings.

Figure 1:
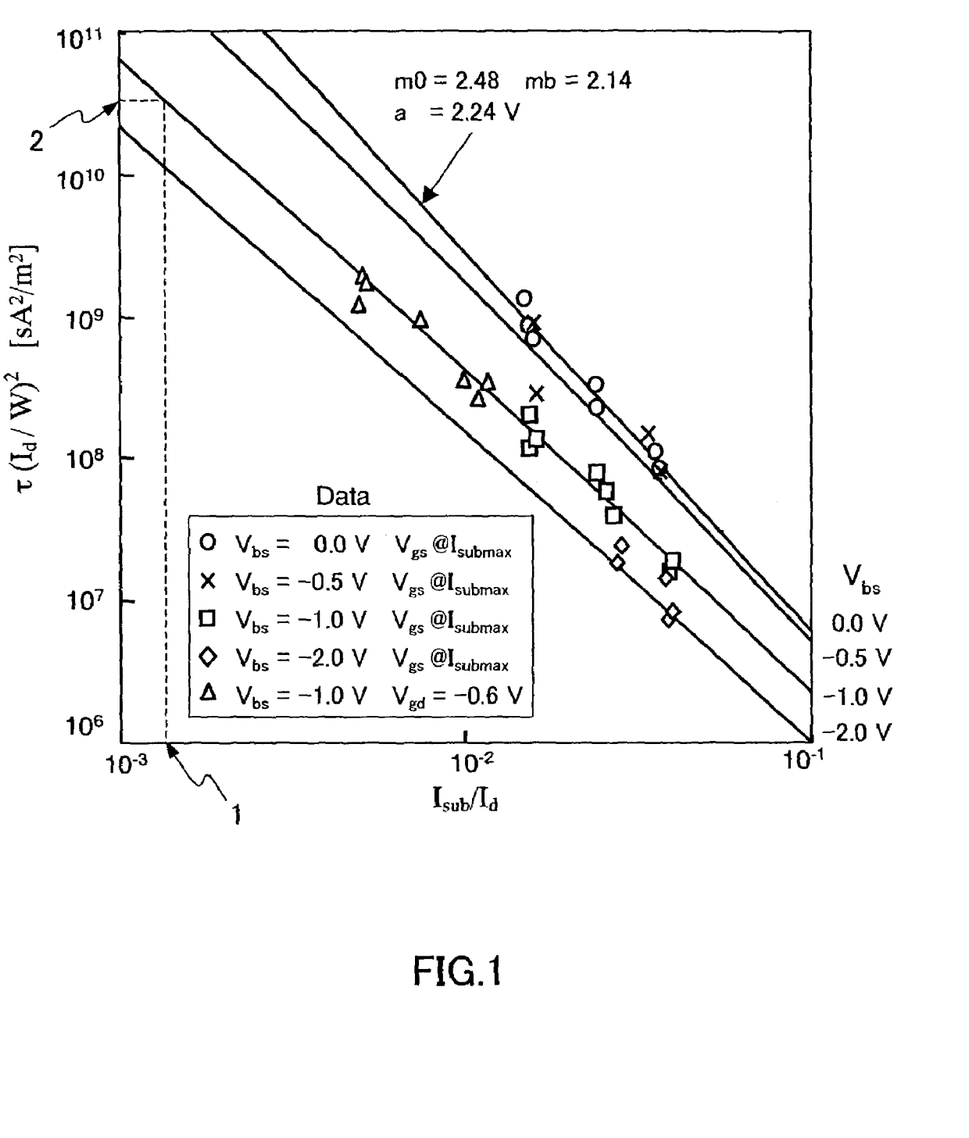
FIG. 1 is an explanatory view to show a method of estimating a lifetime on the basis of a hot carrier lifetime model in an embodiment of the present invention.

FIG. 1 shows a method of estimating a lifetime based on hot carrier lifetime model formulas (12), (13) and (14) according to the present invention. In FIG. 1, the vertical axis is a logarithmic scale of a value $\tau \cdot (I_d/W)^2$ calculated from a lifetime $\tau$ in a DC stress experiment, a drain current $I_d$ during a stress, and a gate width W of a MOS transistor. The horizontal axis is a logarithmic scale of a ratio $I_{sub}/I_d$, where $I_{sub}$ is a substrate current during a stress and $I_d$ is a drain current. Data indicated with respective marks of ○, x, □, △, ◊ are values measured under varied conditions. Here, $V_{gs}@I_{submax}$ denotes a gate-source voltage $V_{gs}$ at the time that the substrate current $I_{sub}$ becomes maximum. The plural curves denote fitting curves based on the hot carrier model formulas (12), (13) and (14) corresponding to the respective substrate voltages. A point 1 on the horizontal axis denotes a maximum value of $I_{sub}/I_d$ in actual use, and a point 2 on the vertical axis denotes a value of $\tau \cdot (I_d/W)^2$ on the fitting curves at the maximum value of the substrate voltage and $I_{sub}/I_d$ in actual use.

As shown in FIG. 1, the hot carrier lifetime deteriorates with application of substrate voltage. According to this model, based on physical grounds, deterioration of this hot carrier lifetime caused by application of substrate voltage can be written accurately with respect to wide ranges of drain and gate voltages. An estimated lifetime at the maximum values of the substrate voltage and $I_{sub}/I_d$ in actual use can be calculated on the basis of a value $\tau \cdot (I_d/W)^2$ determined at the point 2 on the $\tau \cdot (I_d/W)^2$ axis.

Figure 2:
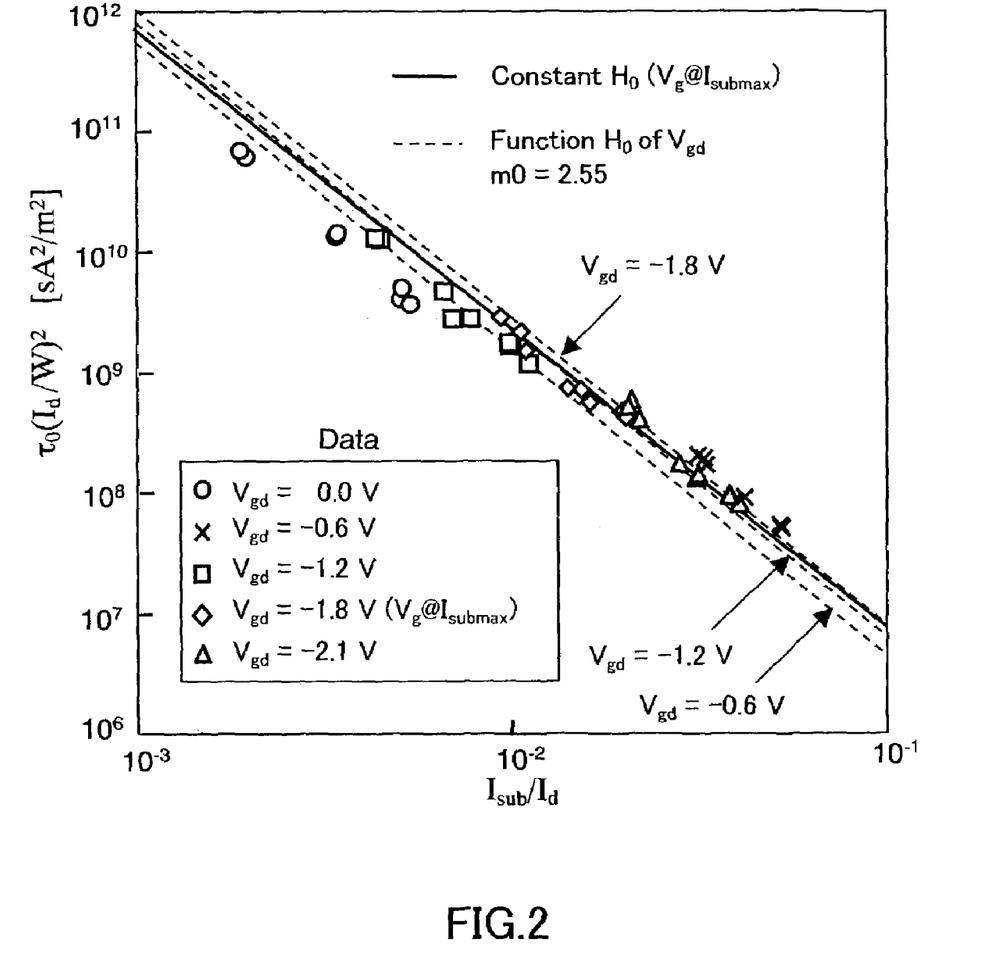
FIG. 2 is an explanatory view to show a method of extracting a hot carrier lifetime parameter as a constant in an embodiment of the present invention.

FIG. 2 is an explanatory view to show a method of extracting model parameters $H_0$ and m0. In FIG. 2, the vertical axis is a logarithmic scale of a value $\tau_0 \cdot (I_d/W)^2$ calculated from $\tau_0$ lifetime o in a DC stress experiment at the substrate voltage $V_{bs}=0$, a drain current $I_d$ during a stress and a gate width W of a MOS transistor. The horizontal axis is a logarithmic scale of a ratio $I_{sub}/I_d$, where $I_{sub}$ is a substrate current during a stress and $I_d$ is a drain current. Data indicated with respective marks of ○, □, ◊, △, x are measured values.

First, a method for determining a parameter $H_0$ as a constant will be explained blow. The following method is used for applying stress voltage used in a stress acceleration experiment in evaluation of the hot carrier reliability. That is, a gate voltage $V_g$ with a maximum substrate current $I_{sub}$ is used with respect to plural drain voltages $V_d$ used for the acceleration experiment. This voltage is indicated as $V_g\{fourth\ root\}I_{submax}$ in FIG. 2. At this time, one gate voltage is set for every drain voltage. In this manner, a line, fitted by a least squares method with respect to data concerning the measurement points, is obtained. In FIG. 2, the fitted straight lines are shown as solid lines. Hot carrier parameters $H_0$ and m0 are obtained respectively from an intercept and a gradient of the line.

For determining a parameter $h_0$ of the model formula (15) by using the parameter $H_0$ as a function of $V_{gd}$, the following method is used for applying stress voltage used in a stress acceleration experiment in evaluation of hot carrier reliability. That is, plural gate-drain voltages $V_{gd}$ are set, to which plural drain voltages $V_d$ used for the acceleration experiment are applied respectively. In this manner, a plurality of parallel straight lines, fitted with a common gradient for every gate-drain voltage $V_{gd}$ by a least squares method with respect to data concerning the measurement points, are obtained. In FIG. 2, the fitted parallel straight lines are shown as broken lines. From the gradient of the parallel straight lines, a hot carrier lifetime parameter m0 is obtained as a constant. $H_0$ is determined as a function of $V_{gd}$ from the plural intercepts of the parallel straight lines, and thereby a parameter $h_0$ is determined. FIG. 2 demonstrates that sufficient accuracy is obtained even when regarding $H_0$ as a constant.

Figure 3:
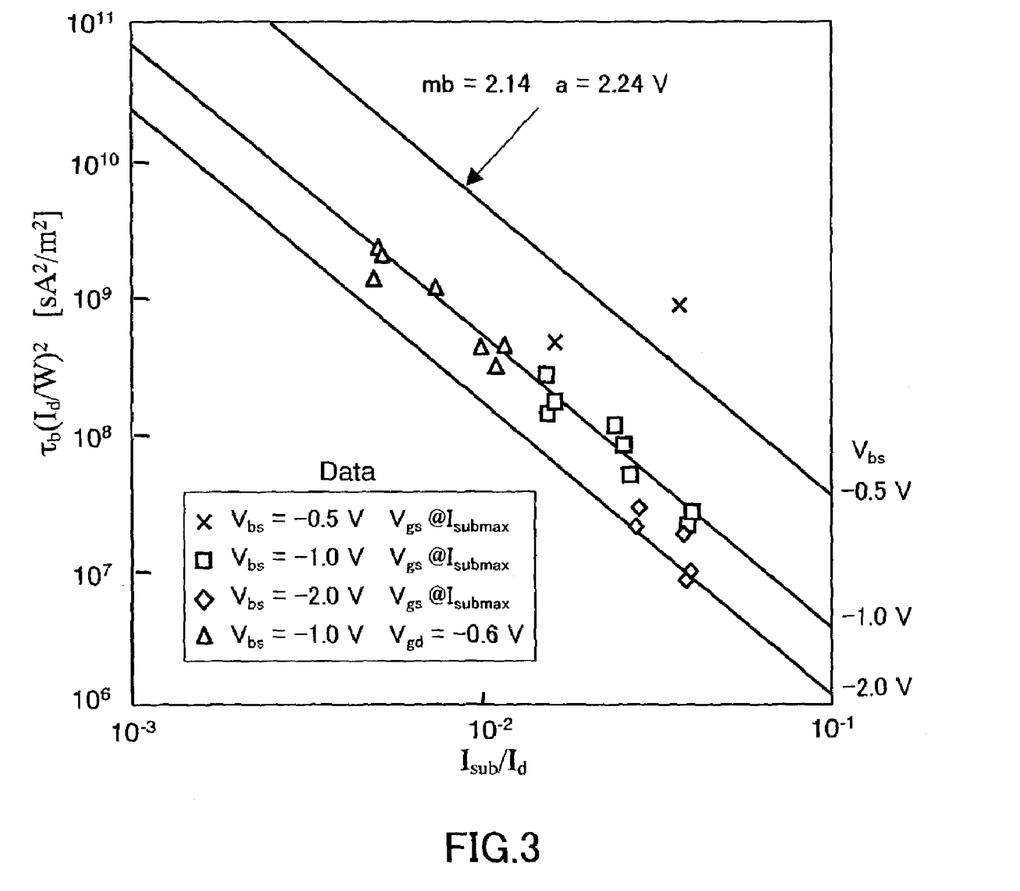
FIG. 3 is an explanatory view to show a method of extracting a hot carrier lifetime parameter as a constant in an embodiment of the present invention.

FIG. 3 is an explanatory view to show a method of extracting model parameters a, $H_b$, and mb. In FIG. 3, $\tau_b$ denotes a quantity representing deterioration of lifetime at the substrate voltage $|V_{bs}|>0$ which is calculated on the basis of the model formulas (12) and (13) from a measured value $\tau$ of the lifetime in a DC stress experiment at the substrate voltage $|V_{bs}|>0$, and the model parameters $H_0$ and m0 determined previously as constants. The vertical axis is a logarithmic scale of a value $\tau_b \cdot (I_d/W)^2$ calculated from $\tau_b$, a drain current $I_d$ during a stress, and a gate width W of a MOS transistor. Data indicated with marks of x, □, ◊, △ are values respectively measured from measured values. The solid lines are parallel straight lines fitted for the respective substrate voltages $V_{bs}$. A parameter mb is determined from a gradient of the parallel straight lines. Parameters 'a' and $H_b$ are determined by fitting the respective intercepts of the parallel straight lines and the intervals thereof.

For obtaining a parameter $h_0$ of the model formula (16) by using the parameter $H_b$ as a function of $V_{gd}$, the following method is used for applying stress voltage used in a stress acceleration experiment in evaluation of hot carrier reliability. That is, in a case of applying a substrate voltage, a plurality of gate-drain voltages $V_{gd}$ are set, to which plural drain voltages $V_d$ used for the acceleration experiment are applied respectively. In this manner, similar to the case for determining the parameter $h_0$, a plurality of parallel straight lines, fitted with a common gradient for every gate-drain voltage $V_{gd}$ by a least squares method with respect to data concerning the measurement points, are obtained. From the gradient of the parallel straight lines, a hot carrier lifetime parameter mb is obtained as a constant. $H_b$ is determined as a function of $V_{gd}$ from the plural intercepts of the parallel straight lines, and thereby a parameter $h_b$ is determined. FIG. 3 demonstrates that sufficient accuracy is obtained even when regarding $H_b$ as a constant.

Figure 4:
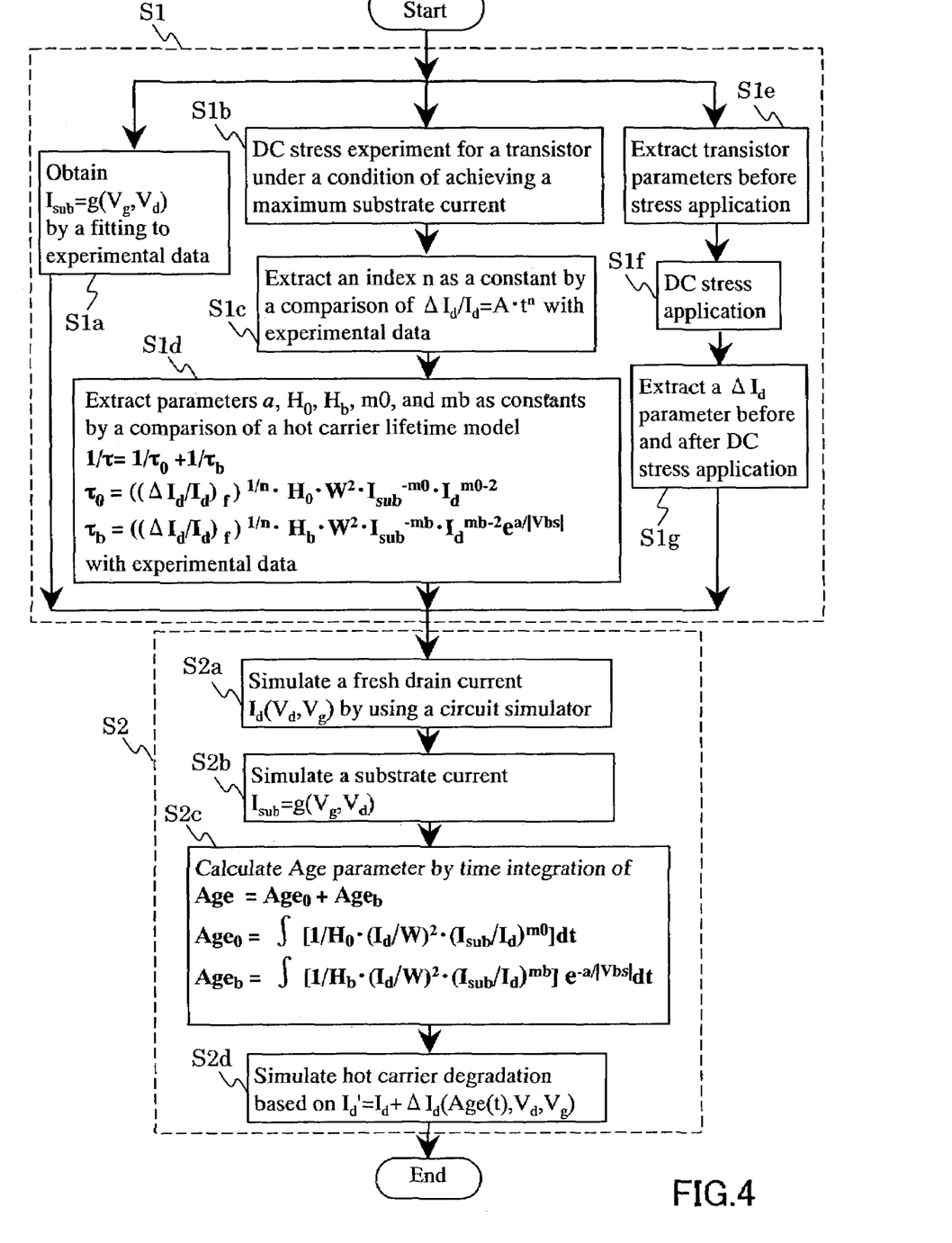
FIG. 4 is a flow chart to show a method of simulating circuit characteristic degradation in an embodiment of the present invention.

FIG. 4 is a flow chart showing a method of simulating circuit characteristic degradation according to the present invention. In the flow chart, a step S1 includes sub-steps S1a–S1g to extract unknown parameters in the formulas (10), (17), (18) and (19) by using a preliminary measuring experiment.

In the sub-step S1a, in order to determine a substrate current $I_{sub}$ in the formulas (17), (18) and (19), a model formula $I_{sub}=g(V_g, V_d)$ is determined to fit with a plurality of substrate current $I_{sub}$ measurement data in the preliminary measuring experiment. Here, $V_g$ represents a gate voltage, and $V_d$ represents a drain voltage. A method of determining a substrate current $I_{sub}$ is described in IEEE Electron Device Lett., vol. EDL-5, pp. 505–507, December 1984 by Chan et al.

The sub-steps S1b–S1d serve to extract hot carrier lifetime parameters by a preliminary measuring experiment. In the sub-step S1b, stress voltage is applied to a MOS transistor in order to measure a hot carrier lifetime defined in the formula (2). For applying the stress voltage, a gate voltage $V_g$ causing a maximum substrate current $I_{sub}$ is used with respect to plural drain voltages $V_d$. At this time, one gate voltage is set for every drain voltage. In the subsequent sub-step S1c, a coefficient n is extracted as a constant by a comparison between the empirical formula (1) and data concerning plural measurement points in a DC stress experiment in the sub-step S1b. Similarly in the sub-step S1d, model parameters 'a', $H_0$, $H_b$, m0 and mb are extracted as constants by a comparison between the empirical formulas (12), (13), and (14) and data concerning plural measurement points in a DC stress experiment of the sub-step S1b.

The sub-steps S1e–S1g serve to determine a fresh drain current $I_d$ before applying stress and drain current degradation $\Delta I_d$ in the formula (10) for a $\Delta I_d$ model. In the sub-step S1e, transistor parameters, such as a flat band voltage and carrier mobility to determine fresh drain current $I_d(V_d, V_g)$ before stress application, are extracted. BSIM (Berkeley Short-Channel IGFET Model) can be used for a model to determine such a fresh drain current $I_d(V_d, V_g)$. Details of the BSIM method are described in IEEE J. Solid-State Circuits, vol. SC-22, pp. 558–566, August 1987 by Sheu et al. In the subsequent sub-step S1f, a DC stress is applied to the transistor. In the sub-step S1g, $\Delta I_d$ model parameters before and after DC stress application are extracted. The drain current degradation $\Delta I_d$(Age, $V_d$, $V_g$) is determined from this $\Delta I_d$ model parameter. The $\Delta I_d$ model concerning NMOS is described by the above-mentioned Quader et al. PMOS is described in JP-A-08–64814 by Shimizu et al.

Transistor parameters should be extracted before the DC stress application in order to bring actual transistor characteristics before the stress application to coincide with the simulated transistor characteristics. Similarly, the $\Delta I_d$ model parameters should be extracted before and after the DC stress application in order to bring actual drain current degradation $\Delta I_d$ after the stress application to coincide with the simulated drain current degradation $\Delta I_d$.

A step S2 includes sub-steps S2a–S2d in which a reliability simulator simulates hot carrier degradation of a transistor in accordance with the parameters extracted in the step S1 and the formulas (10), (17), (18) and (19).

In the sub-step S2a, a drain current is simulated by the transistor parameters before stress application, and the parameters have been extracted in the sub-step S1e. In the sub-step S2b, a substrate current is simulated by the substrate current model formula $I_{sub}=g(V_g, V_d)$ determined by the S1a. In the sub-step S2c, Age, which represents degradation of every transistor on the basis of the formulas (17), (18) and (19), is calculated by time integration of a function of a drain current $I_d$ and substrate current $I_{sub}$ in a circuit. At this time, a drain current $I_d$ simulated in the sub-step S2a, a substrate current $I_{sub}$ simulated in the sub-step S2b, and model parameters a, $H_0$, $H_b$, m0, and mb calculated in the sub-step S1d, are used. In the sub-step S2d, hot carrier degradation of the transistor is simulated based on the Age, by using the formula (10).

In a MOS transistor, a plurality of degradation modes may exist depending on the stress voltage or the stress temperature. In such a case, the degraded drain current $I_d'$ represented by the model formula (10) of the present invention can be replaced by a degraded drain current $I_d'$ for a simulation in accordance with the following formula (20) including one or plural Age' corresponding to other degradation modes.

$$I_d'=I_d(V_d, V_g)+\Delta I_d(\text{Age, Age}', V_d, V_g) \qquad (20)$$

A method of estimating a lifetime according to the present invention or a method of simulating circuit characteristic degradation according to the present invention may be programmed wholly or partly, and executed automatically by a computer. When the method of the present invention cannot be executed automatically, it can be executed manually.

The literature and patent publications discussed above are incorporated herein by reference. The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, all changes that come within the meaning and range of equivalency of the claims are intended to be embraced therein.

What is claimed is:

1. A method of estimating a hot carrier lifetime of a MOS transistor, comprising:
   a) applying plural DC stresses of plural drain voltages, of plural gate voltages and of plural substrate voltages $V_{bs}$ including $V_{bs}=0$ to plural MOS transistors,
   b) measuring respective drain currents $I_d$, respective substrate currents $I_{sub}$ and respective lifetimes $\tau$ under the applied DC stresses, where the lifetimes $\tau$ is defined as a stress time required for a variation rate of drain currents to reach a predetermined value,
   c) extracting hot carrier lifetime parameter mb and 'a' from the measured values of the lifetimes $\tau$, the drain currents $I_d$, the substrate currents $I_{sub}$ and the substrate voltages $V_{bs}$ in a hot carrier lifetime model expressed by:

$$1/\tau = 1/\tau_0 + 1/\tau_b$$

$$\tau_b \propto I_{sub}^{-mb} \cdot I_d^{mb-2} \cdot \exp(a/|V_{bs}|)$$

where $\tau_0$ denotes a lifetime at the time the substrate voltage $V_{bs}=0$, $\tau_b$ denotes a quantity of deterioration of a lifetime at the time the substrate voltage $|V_{bs}|>0$, and the model parameters mb and 'a' represent hot carrier degradation caused by re-bonding between a secondary hot carrier occurring due to application of the substrate voltage and the primary hot carrier, the model parameter mb being defined by the following formula $$mb = (\Phi_h/\lambda_h)/(\Phi_{ei}/\lambda_e) + 2$$

where $\Phi_h$ denotes a critical energy of holes to generate damage, $\Phi_{ei}$ denotes an impact ionization energy of electrons, and $\lambda_h$ and $\lambda_e$ denote respectively mean free paths of holes and electrons,     d) estimating a hot carrier lifetime under a drain current $I_d$, a substrate currents $I_{sub}$, and the substrate voltages $V_{bs}$ in actual use by using the hot carrier lifetime model, the lifetime $\tau_0$, and the model parameters mb and 'a'.

2. A method of simulating hot carrier degradation of a MOS transistor, comprising     a) extracting transistor parameters before stress application,     b) determining a substrate current model formula,     c) applying plural DC stresses of plural drain voltages, of plural gate voltages and of plural substrate voltages $V_{bs}$ including $V_{bs}=0$ to plural MOS transistors,     d) measuring respective drain currents $I_d$, respective substrate currents $I_{sub}$ and respective lifetimes $\tau$ under the applied DC stresses, where the lifetimes $\tau$ is defined as a stress time required for a variation rate $\Delta I_d/I_d$ of drain currents to reach a predetermined value, and $\Delta I_d/I_d$ is defined as a ratio of drain current variation $\Delta I_d$ to an initial drain current $I_d$,     e) extracting, an index n as a constant by a comparison of $\Delta I_d/I_d = A \cdot t^n$ with the measured value under the applied DC stresses, where 't' denotes a hot carrier stress time, and 'A' denotes a coefficient,     f) extracting hot carrier lifetime parameters m0, $H_0$, mb, $H_b$ and 'a' from the measured value of the initial drain current $I_d$, the substrate currents $I_{sub}$ and the substrate voltages $V_{bs}$ in a hot carrier lifetime model expressed by:

$$1/\tau = 1/\tau_0 + 1/\tau_b$$

$$\tau_0 = ((\Delta I_d/I_d)_f)^{1/n} \cdot H_0 \cdot W^2 \cdot I_{sub}^{-m0} \cdot I_d^{m0-2}$$

$$\tau_b = ((\Delta I_d/I_d)_f)^{1/n} \cdot H_b \cdot W^2 \cdot I_{sub}^{-mb} \cdot I_d^{mb-2} \cdot \exp(a/|V_{bs}|)$$

where $(\Delta I_d/I_d)_f$ denotes a variation rate of drain current defining the lifetime $\tau$, 'W' denotes a gate width, $\tau_0$ denotes a lifetime at the time the substrate voltage $V_{bs}=0$, $\tau_b$ denotes a quantity of deterioration of a lifetime at the time the substrate voltage $|V_{bs}|>0$, and the model parameters m0, $H_0$, mb, and $H_b$ 'a' represent hot carrier degradation caused by re-bonding between a secondary hot carrier occurring due to application of the substrate voltage and the primary hot carrier, the model parameter mb being defined as the following formula $$mb = (\Phi_h/\lambda_h)/(\Phi_{ei}/\lambda_e) + 2$$

where $\Phi_h$ denotes a critical energy of holes to generate damage, $\Phi_{ei}$ denotes an impact ionization energy of electrons, and $\lambda_h$ and $\lambda_e$ denote respectively mean free paths of holes and electrons,     g) simulating a drain current by a circuit simulator implemented in a computer by using the transistor parameters before stress application,     h) simulating a substrate current by using the substrate current formula implemented in the computer,     i) calculating a parameter Age representing a cumulative stress quantity with respect to a MOS transistor based on model formulas implemented in the computer expressed by:

$$Age = Age_0 + Age_b$$

$$Age_0 = \int 1/H_0 \cdot (I_d/W)^2 (I_{sub}/I_d)^{m0} \cdot dt$$

$$Age_b = \int 1/H_b \cdot (I_d/W)^2 (I_{sub}/I_d)^{mb} \cdot \exp(-a/|V_{bs}|) dt$$

where $Age_0$ denotes a parameter representing a cumulative stress quantity with respect to a MOS transistor at the time the substrate voltage $V_{bs}=0$, and $Age_b$ denotes a quantity representing an increase of a cumulative stress quantity with respect to the MOS transistor at the time the substrate voltage $|V_{bs}|>0$,     j) simulating hot carrier degradation of the MOS transistor as a function of the Age implemented in the computer.

3. The method of simulating according to claim 2, further comprising calculating a model parameter $H_b$ based on a model formula expressed by:

$$H_b \propto \exp(h_b \cdot |V_{gd}|)$$

where $V_{gd}$ denotes a gate-drain voltage and $h_b$ denotes a model parameter.

4. The method of simulating according to claim 2, further comprising calculating the $Age_0$ based on model a formula expressed by:

$$H_0 \propto \exp(h_0 \cdot |V_{gd}|).$$

* * * * *